(12) United States Patent
Zakel et al.

(10) Patent No.: US 8,742,571 B2
(45) Date of Patent: Jun. 3, 2014

(54) DIODE ARRAY AND METHOD FOR PRODUCING A DIODE ARRAY

(75) Inventors: Elke Zakel, Nauen (DE); Thorsten Teutsch, Santa Cruz, CA (US); Ghassem Azdasht, Berlin (DE); Siavash Tabrizi, Berlin (DE)

(73) Assignee: Pac Tech—Packaging Technologies GmbH (DE)

( * ) Notice: Subject to any disclaimer, the term of this patent is extended or adjusted under 35 U.S.C. 154(b) by 87 days.

(21) Appl. No.: 13/395,939

(22) PCT Filed: Sep. 15, 2010

(86) PCT No.: PCT/DE2010/001082
§ 371 (c)(1),
(2), (4) Date: May 23, 2012

(87) PCT Pub. No.: WO2011/032538
PCT Pub. Date: Mar. 24, 2011

(65) Prior Publication Data
US 2012/0228772 A1 Sep. 13, 2012

(30) Foreign Application Priority Data
Sep. 17, 2009 (DE) .......... 10 2009 041 641

(51) Int. Cl.
*H01L 23/34* (2006.01)
*H01L 21/44* (2006.01)
(52) U.S. Cl.
USPC ........ 257/724; 257/690; 257/665; 257/734; 257/751; 257/762; 257/766; 257/779; 257/E21.509; 438/612; 438/653; 438/123
(58) Field of Classification Search
USPC .......... 257/910, E27.051, E27.073, E21.053, 257/665, 674, 678, 724, 773, E23.186, 257/E25.018, E25.024, 690, 734, 751, 762, 257/766, 772, 779, E21.509; 438/123, 612, 438/653
See application file for complete search history.

(56) References Cited

U.S. PATENT DOCUMENTS

| | | | |
|---|---|---|---|
| 3,042,792 A | 5/1960 | Balder | |
| 3,115,697 A | 12/1963 | Shaver et al. | |
| 3,737,738 A | 6/1973 | Koenig | |

FOREIGN PATENT DOCUMENTS

| | | | |
|---|---|---|---|
| EP | 1 760 783 A2 | 3/2007 | |
| GB | 912 460 | 12/1962 | |
| JP | 58 216448 A | 12/1983 | |
| JP | 63-179555 | * 7/1988 | |
| WO | 2007/056890 | 5/2007 | |

OTHER PUBLICATIONS

International Search Report as mailed on Oct. 14, 2011 for International Application No. PCT/DE2010/001082.

(Continued)

*Primary Examiner* — Jasmine Clark
(74) *Attorney, Agent, or Firm* — Quarles & Brady LLP

(57) ABSTRACT

A diode arrangement includes a diode and two electrodes. Each electrode is connected to the diode in an electrically conductive manner via a soldered connection on one of two oppositely arranged contact surfaces of the diode. The contact surfaces of the diode are formed substantially by the surfaces of a lower side and an upper side of the diode and are contacted with the contact extensions of the electrodes via the soldered connection. The contact extensions forming counter contact surfaces are substantially congruent with the contact surfaces of the diode.

10 Claims, 1 Drawing Sheet

(56) References Cited

OTHER PUBLICATIONS

The European Parliament and the Council of the European Union, Directive 2002/95/EC of the European Parliament and the Council of Jan. 27, 2003 on the Restriction of the Use of Certain Hazardous Substances in Electrical and Electronic Equipment, Official Journal of the European Union, Feb. 13, 2003, pp. L37/19-L37/23, vol. L37, XP002558112.

International Preliminary Report on Patentability as mailed on Mar. 29, 2012 for International Application No. PCT/DE2010/001082.

* cited by examiner

DIODE ARRAY AND METHOD FOR PRODUCING A DIODE ARRAY

CROSS-REFERENCE TO RELATED APPLICATIONS

This application represents the national stage entry of PCT International Application No. PCT/DE2010/001082 filed on Sep. 15, 2010 and claims the benefit of German Patent Application No. DE 10 2009 041 641.2 filed Sep. 17, 2009. The contents of both of these applications are hereby incorporated by reference as if set forth in their entirety herein

STATEMENT REGARDING FEDERALLY SPONSORED RESEARCH OR DEVELOPMENT

Not applicable.

FIELD OF THE INVENTION

The present invention relates to a diode arrangement comprising a diode and two electrodes which are each connected to the diode in an electrically conductive manner via a soldered connection on one of two oppositely arranged contact surfaces of said diode, wherein the contact surfaces of the diode are formed substantially by the surfaces of a lower side and an upper side of the diode and are contacted with contact extensions of the electrodes via the soldered connection, said contact extensions forming counter contact surfaces being substantially congruent with the contact surfaces of the diode. Moreover, the present invention relates to a method for the production of such a diode arrangement.

BACKGROUND OF THE INVENTION

Diode arrangements of the type cited at the beginning are employed for instance as components of solar cells and as so-called "power diodes" are exposed to high electric currents. Basically, such diode arrangements are suitable for all fields of application where high output powers are to be rendered by the diode, so that corresponding cooling measures are to be taken to ensure trouble-free operation of the diodes.

BRIEF SUMMARY OF THE INVENTION

Thus, it is an object of the present invention to suggest a diode arrangement which is characterized by a particularly high operating reliability even in the case of a high power density. It is another object of the invention to suggest a method which makes it possible to efficiently produce such diode arrangements which ensure operational reliability also when subjected to higher temperatures.

In the inventive diode arrangement, the contact surfaces of the diode are formed substantially by the surfaces of a lower side and an upper side of the diode and are contacted with contact extensions of the electrodes via the soldered connection, said contact extensions forming counter contact surfaces being substantially congruent with the contact surfaces of the diode.

Hence, in the diode arrangement according to the invention, the entire surface of a lower side or an upper side of the diode is available for contacting with the electrodes. Thus it is possible to configure the transition resistance between the diode and the electrodes so as to be as low as possible. Due to the contacting of the contact surfaces of the diode with contact extensions of the electrodes, which form substantially congruent counter contact surfaces, it is ensured that the surface area of the soldered connection does not extend beyond the contact surfaces of the diode, such that, as a result, the risk of short-circuits occurring between the lower side and the upper side of the electrode is largely minimized. Due to the aspect that contact extensions are provided at the electrodes for contacting with the diode, it is possible to form the electrodes in any optional manner in those areas which extend beyond the contact extensions, and to thereby form in particular electrodes with a large surface area, which enable a particularly good heat dissipation from the diode, respectively from the soldered connections between the diode and the electrodes.

It proves to be particularly advantageous in the production of the diode arrangement if the electrodes are formed by segments of an electrode substrate made of a conductor material, the contact side of said electrode substrate being furnished with a coating of a solder material barrier having a solder material contact layer applied thereon.

To produce the electrodes it is thus possible to provide a semi-finished product having coatings which are applied for instance by means of a plating process and which simplify the production of a soldered connection with defined properties. In particular, the formation of a solder material barrier provides for a diffusion barrier, which on the one hand enables the production of a soldered connection of a defined composition and on the other hand enhances the production of a soldered connection with a defined height, in order to thereby enable reproducible connecting dimensions of the diode arrangement, which is defined for instance by the distance a between the electrodes being disposed on different surfaces of the diode.

It has proven to be particularly advantageous if the electrode substrate is formed of copper or a copper alloy, if the solder material barrier comprises nickel or a nickel alloy and if the solder material contact layer comprises tin or a tin alloy.

In the inventive method, contact extensions formed at the electrodes and forming counter contact surfaces, the surface area of which substantially conforms to a lower side and an upper side of the diode, are furnished with a solder material coating, and in order to from a soldered connection the diode is subsequently disposed in a sandwich arrangement between the electrodes in such a manner that the counter contact surfaces of the contact extensions are disposed so as to overlap with the contact surfaces being formed by the lower side or the upper side of the diode.

It is particularly advantageous if a reflow of the solder material coating applied onto the contact extensions of the electrodes is performed already prior to the production of the sandwich arrangement and the formation of the soldered connection, particularly in order to be able to largely preclude the occurring of short-circuits between the lower side and the upper side of the diode during the subsequent formation of the soldered connection.

It is particularly advantageous for an automated production of the diode arrangement if the production of the sandwich arrangement is performed in two phases in such a manner that in a first phase, a first overlapping arrangement is produced between the counter contact surface of the first electrode and the first contact surface of the diode, and subsequently in a second phase, a second overlapping arrangement is produced between the counter contact surface of the second electrode and the second contact surface of the diode.

In this context, it has proven to be advantageous, in particular in terms of handling the elements in the production of the sandwich arrangement, if the first overlapping arrangement is produced by applying the diode with the first contact surface thereof onto the counter contact surface of the first electrode, and if the second overlapping arrangement is subsequently produced by applying the second electrode with the counter contact surface thereof onto the second contact surface of the diode.

In a possible alternative of the method, the soldered connection is formed subsequent to the production of the sandwich arrangement.

It is particularly advantageous if the formation of the soldered connection is performed in two phases such that a first soldered connection is produced subsequent to the production of the first overlapping arrangement, and a second soldered connection is produced subsequent to the production of the second overlapping arrangement.

If a rear side of the contact extension of at least one electrode is subjected to the action of laser energy in order to form the soldered connection, the relative arrangement of the diode and of the electrode-preserving sandwich arrangement thus defined can be maintained unchanged during the formation of the soldered connection.

If, in order to provide the electrodes for a subsequent formation of the sandwich arrangement, the electrodes are formed by removing segments of a strip-shaped electrode substrate such that subsequent to the removal of the segments the strip-shaped configuration of the electrode substrate is maintained, a semi-finished product can be used for the production, respectively provision of the electrodes, which is formed so as to be continuous and in particular is not required to have a structuring for producing the electrodes.

DETAILED DESCRIPTION OF THE EXAMPLE EMBODIMENTS

Hereinafter, a preferred embodiment of the diode arrangement as well as a method for producing a diode arrangement are described in greater detail by way of example with reference to the drawings.

Figure 1:
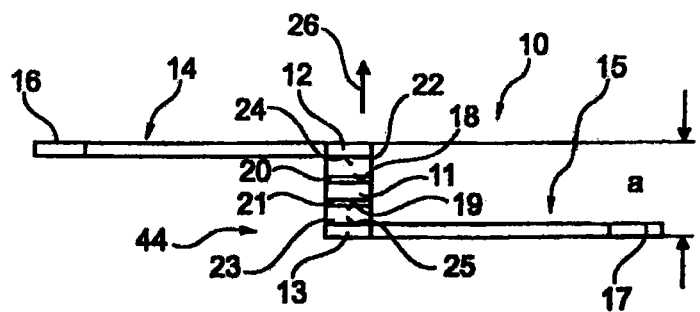
FIG. 1 shows a diode arrangement in a lateral view.

FIG. 1 shows a diode arrangement 10 being formed in a stacked arrangement or sandwich arrangement 44, comprising a diode 11 being disposed between two contact extensions 12, 13, which are each formed at a free contact end of strip-shaped electrodes 14, 15.

Figure 2:
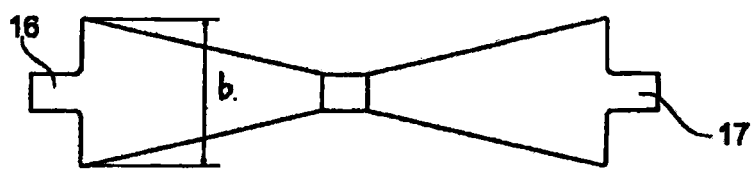
FIG. 2 shows a diode arrangement in a top view.

As can be seen in particular from FIG. 2, the electrodes 14, 15 at their ends being diametrically opposed to the contact extensions 12, 13 have further contact extensions 16, 17 serving for the electrically conductive connection of the diode arrangement 10 with further terminal devices.

As can also be seen from FIG. 1, the stacked arrangement having a height a produces a contact structure between the contact extensions 12, 13 of the electrodes 14, 15, said contact structure having a diode contact surface 20, 21 on an upper side 18 and a lower side 19 of the diode 11, respectively, which diode contact surface can be configured as a metallic terminal face of a blank diode, so that the diode 11 illustrated in FIG. 1 for instance may be a diode which has been separated from a wafer assembly by means of sawing directly before being disposed in the stacked arrangement illustrated in FIG. 1, wherein in particular the diode contact surfaces 20, 21 have not been prepared yet, i.e. they are still in an unprocessed state.

On each of the diode contact surfaces 20, 21 provision is made for a soldered connection 22, 23 formed by a molten solder material which forms an electrically conductive and mechanically resistant connection between the diode contact surfaces 20, 21 and the counter contact surfaces 24, 25 of the contact extensions 12, 13.

As is apparent from a combined view of FIGS. 1 and 2, the dimensions of the contact extensions 12, 13 and the diode 11 are adjusted to each other such that, as can be seen in particular from FIG. 2, a congruent arrangement is realized resulting in a substantially flush arrangement of the contact structure in the stacking direction 26 illustrated in FIG. 1.

Moreover, FIGS. 1 and 2 clearly show that both the diode contact surfaces 20, 21 and the counter contact surfaces 24, 25 formed by the contact extensions 12, 13 have a congruent surface area or dimension.

Said adjusted surface area in combination with the capillary forces arising in the region of the soldered connections 22, 23 in response to a remelting process of the solder material for forming the soldered connections 22, 23 prevents the formation of solder material bridges between the upper side 18 and the lower side 19 of the diode 11 during the formation of the soldered connection.

As can be seen from FIG. 2, the electrodes 14, 15 between their contact extensions 12 and 16, respectively 13 and 17, starting from the contact extensions 12, 13 serving for contacting with the diode 11 have an increasing width b, wherein the contact extensions 16, 17 are of a smaller configuration. As a result, on the one hand it is ensured, as already previously described in extenso, that a formation of soldered connections 22, 23 in the region of the diode 11 is enabled without the risk of short-circuits. On the other hand, it is still possible to form a large cooling surface by the incidentally wide dimensioning of the electrodes 14, 15, which during power operation of the diode 11 counteracts thermal overstressing of the diode 11 or of the soldered connections 22, 23.

Figure 3:
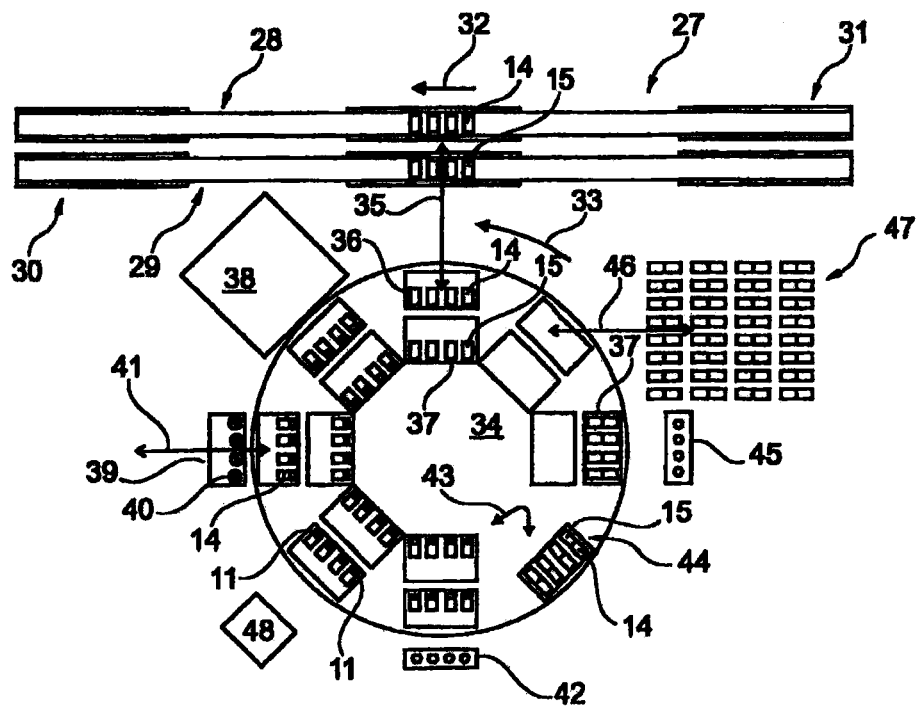
FIG. 3 shows a schematic view of the method for the production the diode arrangement.

Hereinafter, a possible method for producing the diode arrangement shown in FIGS. 1 and 2 will be explained in greater detail with reference to FIG. 3. For this purpose, FIG. 3 inter alia shows a device for the production of diode arrangements 10, comprising a supply device 27 that serves for supplying a strip-shaped electrode substrate and by means of which two electrode substrate strips 28, 29 are continuously supplied via a winding device 30 and an unwinding device 31 in the supply direction 32.

The electrode substrate strips 28, 29 in the present case have a multilayered structure having a copper strip which is furnished with a solder material barrier acting as a diffusion barrier and having a solder material contact layer applied thereon. Preferably, the afore-described structure comprising a solder material barrier having a solder material contact layer formed thereon is disposed both on the lower side and on the upper side of the electrode substrate strips.

As is also apparent from FIG. 3, a rotary indexing table 34 is a component of the device for producing the diode arrangements 10, wherein in the indexing mode said indexing table 34 is advanced in the direction of rotation 33 and by means of a transfer device 35 transfers electrodes 14, 15 taken over from the supply device 27 to different devices to be explained hereinafter.

The transfer device 35 is furnished with a punching device (not shown here in greater detail), which separates electrodes 14, 15 from the continuously uniformly configured electrode substrate strips 28, 29 by means of punching and transfers the electrodes to a respective electrode receptacle 36, 37 formed on the rotary indexing table 34. In detail, in the method exemplarily illustrated in FIG. 3, for this purpose a plurality of electrodes 14 are firstly removed from the electrode substrate strip 28 and are transferred into the electrode receptacle 36 being assigned to the periphery of the rotary indexing table 34, which in the case at hand results in that four electrodes 14 are disposed in a row in the electrode receptacle 36.

Subsequently, electrodes 15 are separated from the electrode substrate strip 29 by means of punching and are transferred into the electrode receptacle 37 which is disposed adjacent to the electrode receptacle 36, in such a manner that four electrodes 15 are disposed in a row in the electrode receptacle 37. Subsequently, the electrodes 14 and 15 received in the electrode receptacles 36, 37 are transferred to a solder material application device 38 by executing a rotary indexing movement in the direction of rotation 33. In the solder material application device 38, solder material is applied onto the contact extensions 12, 13 of the electrodes 14, 15, which are not shown in detail in FIG. 3, wherein said application can be performed for instance by applying a solder material deposit in the form of a solder paste. By the same token, solder material deposits can be applied in an at least partially molten state onto the contact extensions 12, 13 of the electrodes 14, 15.

Subsequently, in response to the execution of another rotary indexing movement in the direction of rotation 33, the electrodes 14, 15 are transferred to a remelting device 39 which can be composed for instance of a laser arrangement, in particular a laser diode arrangement, wherein four laser diodes 40 are disposed in a row corresponding to the electrodes 14, 15 received in the electrode receptacles 36, 37. By means of a radial advance movement 41 of the laser diodes 40, said laser diodes can be positioned so as to overlap with the solder material deposits disposed on the electrodes 14, such that a rear side of the solder material deposits can be subjected to the action of laser energy from below the rotary indexing table 34 through the electrodes 14.

Subsequent to the melting of the solder material deposits on the electrodes 14, four diodes 11 disposed in a row are applied onto the molten solder material deposits of the electrodes 14 with the aid of a supply device 48.

Subsequent to another rotary indexing movement, the electrodes 14 being furnished with the diodes 11 are transferred to another remelting device 42 which is essentially formed like the previously described remelting device 39 and makes it possible to subject a rear side of the electrodes 14 to the action of laser energy from a position below the rotary indexing table 34, resulting in the formation of a first soldered connection 22 between the electrodes 14 and the diodes 11 (FIG. 1).

Subsequent to the transfer of the electrodes 14 and 15 to a stacking device 43, the electrodes 15 are transferred into a stacked arrangement with the electrodes 14 by performing a change of direction such that the relative arrangement of the electrodes 14 and 15 as illustrated in FIG. 1 is realized. For the purpose of fixing the stacked arrangement 44 and producing the diode arrangement 10 illustrated in FIG. 1, subsequent to the execution of another rotary indexing movement into the direction of rotation 33, the stacked arrangement 44 is transferred to another remelting device 45 which forms the further soldered connection 23 (FIG. 1) by means of remelting the solder material deposits disposed on the electrodes 15. In this process, a corresponding impingement with laser energy can be performed optionally from below the rotary indexing table 34 or also from above of the rotary indexing table 34, wherein in the first case, the production of the soldered connection 23 is performed with the aid of an energy flux via the electrodes 14, the soldered connections 22 and the diodes 11, and in the second case, a comparatively more direct energy impingement is performed via the electrodes 15. However, irrespective of the direction of impingement, in any case an energy impingement is performed from a rear side via the respective electrodes 14 or 15.

Subsequent to the transfer of the completed diode arrangements 10, the diode arrangements can be removed from the electrode receptacle 37 by means of a removal device 46 and can be transferred to a storage arrangement 47 which can serve as a removal reservoir for further processing of the diode arrangements 10.

The invention claimed is:

1. A diode arrangement comprising:
a diode, said diode having two oppositely arranged contact surfaces, wherein the contact surfaces of the diode are formed substantially by surfaces of a lower side and an upper side of the diode; and
two electrodes, each of said electrodes connected to the diode in an electrically conductive manner via a soldered connection on one of the two oppositely arranged contact surfaces of said diode, wherein the contact surfaces of the diode are contacted with contact extensions of the electrodes via the soldered connection, said contact extensions forming counter contact surfaces substantially congruent with the contact surfaces of the diode, said diode and contact extensions forming a substantially flush arrangement in a stacking direction.

2. The diode arrangement according to claim 1, in which the electrodes are formed by segments of an electrode substrate made of a conductor material, the contact surface of said electrode substrate being furnished with a coating of a solder material barrier having a solder material contact layer applied thereon.

3. The diode arrangement according to claim 2, in which the electrode substrate is formed of copper or a copper alloy, the solder material barrier contains nickel or a nickel alloy and the solder material contact layer contains tin or a tin alloy.

4. A method for producing a diode arrangement including a diode, a first electrode, and a second electrode, said method comprising:
connecting each electrode to the diode in an electrically conductive manner via a soldered connection on one of two oppositely arranged first and second contact surfaces of said diode;
forming contact extensions at the electrodes to form counter contact surfaces which have a surface area substantially conforming to a lower side and an upper side of the diode and which are furnished with a solder material coating applied onto the contact extensions, and for producing a soldered connection; and
sandwiching the diode between the electrodes to form a sandwich arrangement, such that the counter contact surfaces of the contact extensions are disposed so as to overlap with the contact surfaces formed by the lower side and the upper side of the diode and form a substantially flush arrangement in a stacking direction.

5. The method according to claim 4, in which a reflow of the solder material coating applied onto the contact extensions is performed prior to forming the sandwich arrangement and the soldered connection.

6. The method according to claim 5, in which one of said counter contact surfaces is a counter contact surface of the first electrode and another of said counter contact surfaces is a counter contact surface of the second electrode, and formation of the sandwich arrangement is performed in two phases, in a first phase, a first overlapping arrangement is produced between the counter contact surface of the first electrode and the first contact surface of the diode, and subsequently in a second phase, a second overlapping arrangement is produced between the counter contact surface of the second electrode and the second contact surface of the diode.

7. The method according to claim 6, in which the soldered connections are formed subsequent to forming of the sandwich arrangement.

8. The method according to claim 6, in which the soldered connections are formed in two phases, in such a manner that a first soldered connection is produced subsequent to the production of the first overlapping arrangement, and a second soldered connection is produced subsequent to the production of the second overlapping arrangement.

9. The method according to claim 4, in which in order to form the soldered connection, a rear side of the contact extension of at least one electrode is subjected to laser energy.

10. The method according to claim 4, in which in order to provide the electrodes for a subsequent formation of the sandwich arrangement, the electrodes are formed by removing segments of a strip-shaped electrode substrate, such that subsequent to the removal of the segments, a strip-shaped configuration of the electrode substrate is maintained.

\* \* \* \* \*